(12) United States Patent
Djogo

(10) Patent No.: US 11,385,263 B2
(45) Date of Patent: Jul. 12, 2022

(54) CAPACITIVE VOLTAGE SENSOR WITH A HIDDEN SENSING ELECTRODE

(71) Applicant: S&C Electric Company, Chicago, IL (US)

(72) Inventor: Goran Djogo, Mount Prospect, IL (US)

(73) Assignee: S&C Electric Company, Chicago, IL (US)

( * ) Notice: Subject to any disclaimer, the term of this patent is extended or adjusted under 35 U.S.C. 154(b) by 463 days.

(21) Appl. No.: 16/580,390

(22) Filed: Sep. 24, 2019

(65) Prior Publication Data

US 2020/0124642 A1 Apr. 23, 2020

Related U.S. Application Data

(60) Provisional application No. 62/747,224, filed on Oct. 18, 2018.

(51) Int. Cl.
*G01R 15/16* (2006.01)
*H01G 4/01* (2006.01)
*H01G 4/38* (2006.01)

(52) U.S. Cl.
CPC ............... *G01R 15/16* (2013.01); *H01G 4/01* (2013.01); *H01G 4/385* (2013.01)

(58) Field of Classification Search
CPC . G01R 15/16; H01G 4/01; H01G 4/38; H01G 4/40; H01G 4/385
See application file for complete search history.

(56) References Cited

U.S. PATENT DOCUMENTS

| | | | | |
|---|---|---|---|---|
| 6,864,432 B2* | 3/2005 | Boettcher | ............. | H01B 17/42 174/137 R |
| 8,823,387 B1* | 9/2014 | Bullock | ................. | H02H 3/046 324/550 |
| 9,588,161 B2* | 3/2017 | Savich | ..................... | H01T 23/00 |
| 9,742,180 B2* | 8/2017 | Wentzel | ................... | H02G 1/14 |
| 2010/0156441 A1* | 6/2010 | Moliton | ................... | H01G 4/30 324/681 |
| 2011/0121820 A1* | 5/2011 | Handshoe | ............. | G01R 15/16 361/301.3 |
| 2012/0019267 A1* | 1/2012 | Tabuchi | .................. | H01Q 7/00 324/686 |
| 2016/0187390 A1* | 6/2016 | Kshirsagar | ......... | G01R 19/0046 324/126 |
| 2017/0032912 A1* | 2/2017 | Shang | ................ | H01H 33/6606 |

* cited by examiner

*Primary Examiner* — Dominic E Hawkins

(57) ABSTRACT

A capacitive network for use in a voltage sensor includes a first conductor shaped to form a boundary that separates a first interior space and a first exterior space; a second conductor shaped to form a boundary that encircles a second interior space and separates the second interior space from a second exterior space; a third conductor disposed in the second interior space and having a line of sight to the first conductor through an opening in the second conductor; and an external insulator formed around the first conductor and the second conductor in the first exterior space and the second exterior space. A first capacitance is formed between the first conductor and the third conductor, a second capacitance is formed between the second conductor and the third conductor, and conductive material that may collect on the external insulator has negligible effect on the first capacitance and the second capacitance.

19 Claims, 4 Drawing Sheets

CAPACITIVE VOLTAGE SENSOR WITH A HIDDEN SENSING ELECTRODE

CROSS-REFERENCE TO RELATED APPLICATION

This application claims the benefit of priority from the U.S. Provisional Application No. 62/747,224, filed on Oct. 18, 2018, the disclosure of which is hereby expressly incorporated herein by reference for all purposes.

TECHNICAL FIELD

The subject matter described herein relates generally to capacitive voltage sensors, and more particularly to capacitive voltage sensors with shielding for sensing electrodes.

BACKGROUND

Electric utility companies endeavor to provide their customers with regulated voltage from a substation. To determine if the distribution feeder voltage out of the substation is within tolerances, a voltage regulator is employed. The voltage regulator may include a capacitive voltage sensor made up of three conductors molded in an insulator.

Environmental pollution material with high conductivity and/or permittivity, such as snow, salt, or other pollution materials may accumulate over time on the exterior of the insulator which can change the internal capacitances of the sensor and, thereby, negatively affect the accuracy of the voltage sensor. The polluted surface can cause the capacitive voltage sensor to not be usable for any application where voltage measuring accuracy is required. Reducing and even eliminating the effect of environmental pollution deposited on the insulator will improve accuracy and availability of the capacitive sensors. Reducing or eliminating the effect of environmental pollution deposited on the insulator may also allow such a sensor to be packaged as a "smart post insulator" for metering in power distribution systems instead of bulky and expensive voltage transformers.

Accordingly, it is desirable to provide systems and methods for reducing the negative effect of environmental pollution on capacitive voltage sensors. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

Embodiments of the subject matter will hereinafter be described in conjunction with the following drawing figures, wherein like numerals denote like elements, and wherein.

DETAILED DESCRIPTION

Figure 1A:
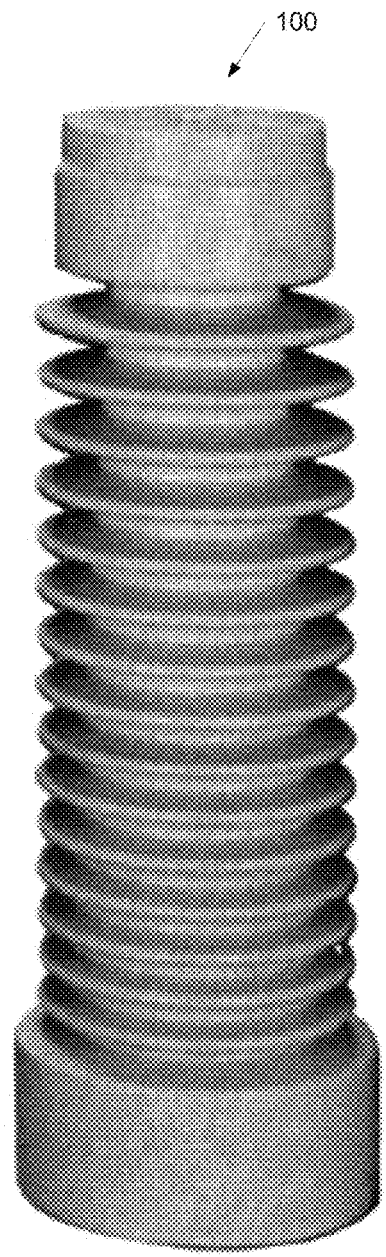
FIG. 1A is a diagram depicting a perspective view of an example voltage sensor that is molded in an insulator, in accordance with some embodiments.

The following detailed description is merely exemplary in nature and is not intended to limit the invention or the application and uses of the invention. Furthermore, there is no intention to be bound by any expressed or implied theory presented in the preceding technical field, background, or the following detailed description. As used herein, the words "exemplary" or "example" means "serving as an example, instance, or illustration." Thus, any embodiment described herein as "exemplary" or "example" is not necessarily to be construed as preferred or advantageous over other embodiments. All embodiments described herein are exemplary embodiments provided to enable persons skilled in the art to make or use the invention and not to limit the scope of the invention which is defined by the claims.

In one embodiment, the subject matter described herein discloses a capacitive voltage sensor that is molded in a polymeric post insulator and that has a voltage measuring accuracy that is not changed by pollution deposits and/or ice/snow deposits. Pollution deposits and/or ice/snow deposits on the external surface of an insulator can significantly change capacitance between the sensing electrode and the HV (high voltage) electrode of a capacitive voltage sensor when there is a line-of-sight between the sensing electrode and the external insulating surface of the sensor. This can significantly deteriorate the voltage measuring accuracy of the sensor.

In one embodiment, a capacitive network for use in a voltage sensor is disclosed. The capacitive network includes a first conductor shaped to form a boundary that separates a first interior space and a first exterior space; a second conductor shaped to form a boundary that encircles a second interior space and separates the second interior space from a second exterior space; a third conductor disposed in the second interior space and having a line of sight to the first conductor through an opening in the second conductor; and an external insulator formed around the first conductor and the second conductor in the first exterior space and the second exterior space. A first capacitance is formed between the first conductor and the third conductor, a second capacitance is formed between the second conductor and the third conductor, and conductive material that may collect on the external insulator may have negligible effect on the first capacitance and the second capacitance and, thereby, a negligible effect on the capacitive voltage divider that those capacitances effectively make.

In another embodiment, a voltage sensor is provided. The voltage sensor includes an amplifier configured to receive a sensing voltage level from a capacitive divider and output an amplified output to an analog to digital converter; and a capacitive network configured to provide the capacitive divider. The capacitive network includes a first conductor shaped to form a boundary that separates a first interior space and a first exterior space; a second conductor shaped to form a boundary that encircles a second interior space and separates the second interior space from a second exterior space; a third conductor disposed in the second interior space and having a line of sight to the first conductor through an opening in the second conductor; and an external insulator formed around the first conductor and the second conductor in the first exterior space and the second exterior space. A first capacitance is formed between the first conductor and the third conductor, a second capacitance is formed between the second conductor and the third conductor, and the capacitive divider includes the first capacitance and the second capacitance.

In another embodiment, a method in a high voltage sensor is provided. The method includes applying a first voltage to a first conductor that is formed in a shape that cooperates with a second conductor to shield a third conductor from conductive material external to the first and second conductors; applying a second voltage to the second conductor that is formed in a shape that cooperates with the first conductor to shield the third conductor from conductive material external to the first and second conductors; and sensing a third voltage at the third conductor, which is shielded from conductive material external to the first and second conductors.

Figure 1B:
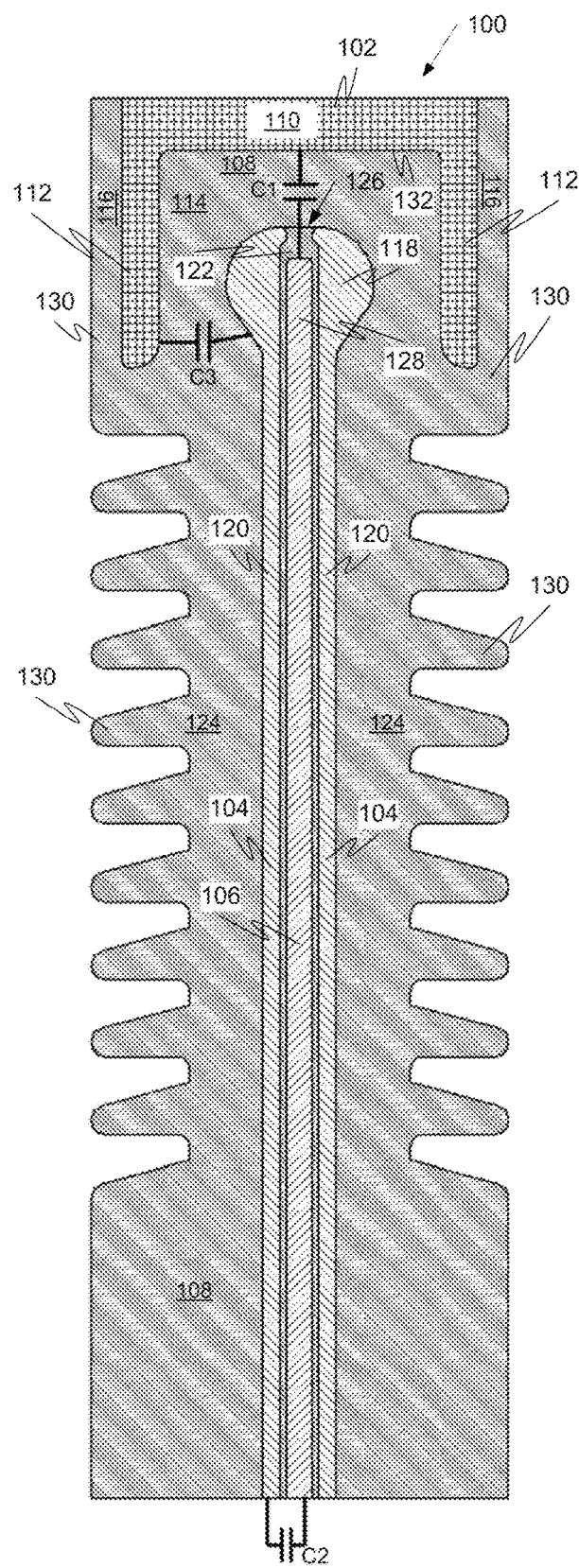
FIG. 1B is a cross-sectional view of the voltage sensor, which shows an example capacitive network in the interior of the voltage sensor, in accordance with some embodiments.

FIG. 1A is a diagram depicting a perspective view of an example voltage sensor 100 that is molded in an insulator and used in a power distribution network. FIG. 1B is a cross-sectional view of the voltage sensor 100, which shows an example capacitive network in the interior of the voltage sensor. The example capacitive network includes a first conductor 102, a second conductor 104, and a third conductor 106. The first conductor 102, second conductor 104, and third conductor 106 are separated from each other via insulator material 108. A first capacitance C1 is formed between the first conductor and the third conductor, a second capacitance C2 is formed between the second conductor and the third conductor, and a third capacitance C3 is formed between the first conductor and the second conductor.

In this example, the first conductor 102 comprises a high voltage (HV) electrode configured to attach to a high voltage line, the second conductor 104 comprises a grounded electrode and configured to attach to a grounded line, and the third conductor 106 comprises a sensing electrode configured to attach to a sensing line. Alternatively, the first conductor 102 may comprise a grounded electrode configured to attach to a grounded voltage line and the second conductor 104 may comprise a HV electrode configured to attach to a high voltage line.

The example first conductor 102 has a bottom section 110 and one or more sides 112 extending away from the bottom section 110. The bottom section 110 and the one or more sides 112 cooperate to form a boundary that separates a first interior space 114 and a first exterior space 116, wherein the first interior space 114 includes insulator material 108.

The example bottom section 110 has a planar face 132 with a perimeter that is formed in a rounded shape such as a circular, elliptical, oval or other rounded shape. The bottom section may alternatively have a perimeter that is formed in a polygonal shape.

The example first conductor 102 has one side 112 that extends away from the planar face 132 of the bottom section 110 and that joins together to form the boundary. The first conductor 102 may alternatively have multiple sides 112 that extend away from the planar face 132 of the bottom section 110 and that join together to form the boundary, such as in the case where the perimeter of the bottom section 110 is formed in a polygonal shape. The one or more sides 112 may extend perpendicularly, rectilinearly, and/or curvilinearly from the bottom section. The bottom section 110 and the one or more sides 112, in the example first conductor 102, cooperate to form a cup-like shape. The bottom section 110 and the one or more sides 112 may be configured to cooperate to form a hollow cubic-like, cuboidal-like, cylindrical-like, cone-like, prism-like, hexagonal prism-like, pyramid-like shape, or other shape that separates an interior section from an exterior section.

The example second conductor 104 has a top section 118 and one or more sides 120 that extend away from the top section 118. The one or more sides 120 join together to form a boundary that encircles a second interior space 122 and separates the second interior space 122 from a second exterior space 124. The top section 118 includes an opening 126. The top section 118, in the example second conductor 104, extends into the first interior space 114.

An external insulator 130 is formed around the first conductor 102 and the second conductor 104 and includes the first exterior space 116 and the second exterior space 124. The first conductor 102 and the second conductor 104 shield the third conductor 106 from conductive material that may collect on the external insulator 130. As a result, the first capacitance C1 and the second capacitance C2 may not be affected by the conductive material that may form on the external insulator 130. The first conductor 102 and the second conductor 104 may shield the third conductor 106 from the conductive material that collects on the external insulator 130 by eliminating a line of sight from the conductive material that collects on the external insulator to the third conductor 106 whereby the conductive material that collects on the external insulator 130 has negligible effect on the first capacitance C1 and the second capacitance C2. For this shielding to be effective, the top section 118 of the second conductor 104 should extend significantly into the first interior space 114, e.g., by at least by 0.5 inches.

The example third conductor 106 is disposed in the second interior space 122 and is separated from the second conductor 104 via insulator material 108. The example third conductor 106 has a first end section 128 that has a line of sight to the first conductor 102 through insulator material 108, the opening 126 in the second conductor 104 and insulator material 122. The first end section 128, in the example third conductor 106, does not extend into the first interior space 114. The first end section 128 should remain below the opening in the second conductor 104, e.g., for at least 0.1 inches, to effectively shield the third conductor from capacitive coupling caused by pollution deposits on the external insulator surface.

In the example capacitive network, the sensing electrode 106 is completely enclosed within the interior of the grounded electrode 104 with only a small opening 126 in the grounded electrode 104 that provides a line-of-sight between the sensing electrode 106 and the HV electrode 102. Also, in the example capacitive network, the HV electrode 102 is extended as a cup shape around the grounded electrode 104. These two measures can prevent a direct line-of-sight between the sensing electrode 106 and the external insulator surface 130 and make capacitance between the sensing electrode 106 and the HV electrode 102 practically independent of a conductive layer on the insulator surface 130. This can result in a capacitive divider ratio between the first capacitance C1 and the second capacitance C2 being completely unaffected by pollution and ice deposits on the insulator surface 130.

Figure 2:
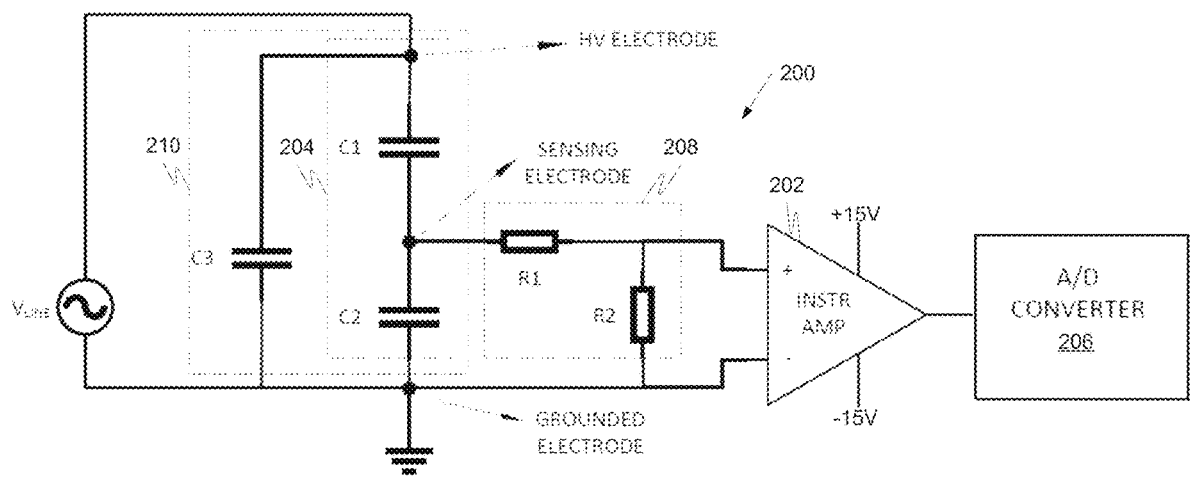
FIG. 2 is a schematic diagram of an electronic measuring circuit in a voltage sensor that uses a capacitive network, in accordance with some embodiments.

FIG. 2 is a schematic diagram of an electronic measuring circuit 200 in a voltage sensor that may use a capacitive network. The example electronic measuring circuit 200 includes an amplifier 202 configured to receive a sensing voltage level from a capacitive divider 204 and output an amplified output to an analog to digital converter 206. The amplifier 202 is configured to receive the sensing voltage level (via a sensing electrode) from the capacitive divider 204 via a resistive divider network 208 (which includes a first resistor R1 and a second resistor R2). The example electronic measuring circuit 200 also includes a capacitive network 210 configured to provide the capacitive divider 204. The capacitive network 210 includes a first conductor (e.g., HV electrode), a second conductor (e.g., grounded electrode), and a third conductor (e.g., sensing electrode). In the capacitive network, a first capacitance C1 is formed between the first conductor and the third conductor, a second capacitance C2 is formed between the second conductor and the third conductor, and a third capacitance C3 formed between the second conductor and the first conductor. The capacitive divider 204 includes the first capacitance C1 and the second capacitance C2. Capacitance C3 can change substantially by pollution deposits on the insulator 130 but the pollution deposits should not affect the output voltage of the capacitive voltage divider C1-C2 because capacitance C3 is parallel to the inputs to capacitive voltage divider C1-C2.

An external insulator is formed around the first conductor and the second conductor. The first conductor and the second conductor shield the third conductor from conductive material that may collect on the external insulator. The first conductor and the second conductor may shield the third conductor from the conductive material that collects on the external insulator by eliminating a line of sight from the conductive material that collects on the external insulator to the third conductor whereby the conductive material that collects on the external insulator has negligible effect on the first capacitance and the second capacitance. As a result, the first capacitance C1 and the second capacitance C2 may not be affected by the conductive material that may form on the external insulator.

In the example electronic measuring circuit 200, example values of parameters are: C1=0.017 pF, C2=170 pF, R1=200 MΩ, and R2=20 MΩ. The capacitive divider ratio can be considered quite high (about 10,000), which can provide a low voltage (about 1-2V) between the sensing electrode and grounded electrode. The low voltage may reduce the likelihood of partial discharges in capacitance C2 even if there are air bubbles bridging the polymeric insulated gap between the sensing electrode and grounded electrode.

Figure 3:
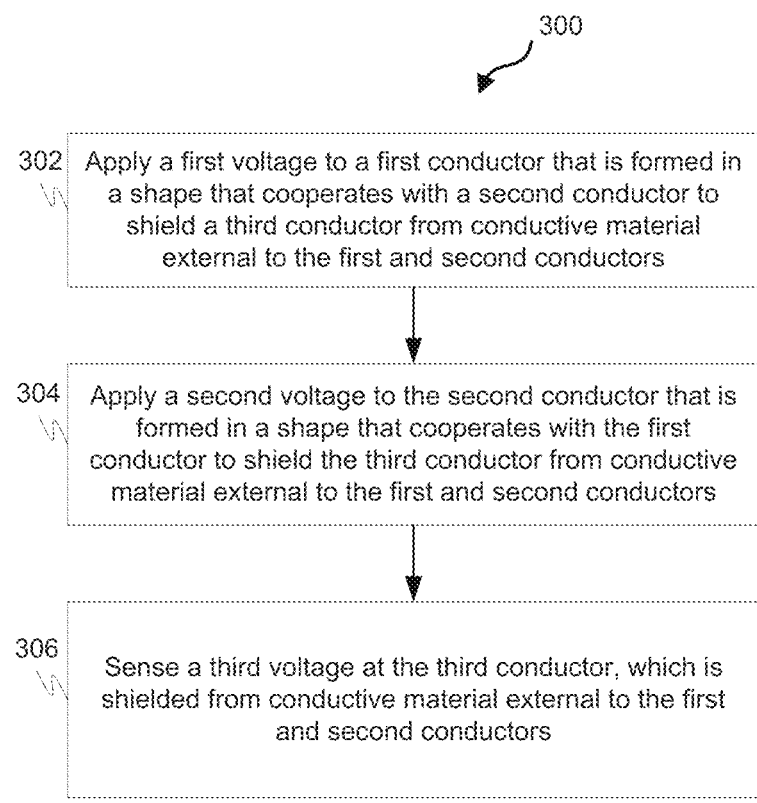
FIG. 3 is a process flow chart depicting an example process 300 in a voltage sensor having a first conductor, a second conductor, and a third conductor, in accordance with some embodiments.

FIG. 3 is a process flow chart depicting an example process 300 in a voltage sensor having a first conductor, a second conductor, and a third conductor. The order of operation within the example process 300 is not limited to the sequential execution as illustrated in the figure, but may be performed in one or more varying orders as applicable and in accordance with the present disclosure.

The example process 300 includes applying a first voltage to a first conductor that is formed in a shape that cooperates with a second conductor to shield a third conductor from conductive material external to the first and second conductors (operation 302). The first conductor may be shaped to form a boundary that separates a first interior space and a first exterior space. The example first conductor may have a bottom section and one or more sides extending away from the bottom section. The bottom section and the one or more sides may cooperate to form a boundary that separates a first interior space and a first exterior space, wherein the first interior space includes insulator material and an external insulator is formed around the first conductor in the first exterior space.

The example process 300 includes applying a second voltage to the second conductor that is formed in a shape that cooperates with the first conductor to shield the third conductor from conductive material external to the first and second conductors (operation 304). The second conductor may be shaped to form a boundary that encircles a second interior space and separate the second interior space from a second exterior space. The example second conductor may have a top section and one or more sides extending away from the top section. The one or more sides may join together to form a boundary that separates a second interior space and a second exterior space. The top section may include an opening, wherein the second interior space includes insulator material and the external insulator is formed around the second conductor in the second exterior space.

The example process 300 includes sensing a third voltage at the third conductor, which is shielded from conductive material external to the first and second conductors (operation 306). The third conductor may be disposed in the second interior space and have a line of sight to the first conductor through an opening in the second conductor. The example third conductor may be disposed in the second interior space and may be separated from the second conductor via insulator material. The third conductor may have a first end section that has a line of sight to the first conductor through insulator material and the opening in the second conductor.

An external insulator may be formed around the first conductor and the second conductor in the first exterior space and the second exterior space, wherein the first conductor and the second conductor cooperate to eliminate a line of sight from the third conductor to the conductive material external to the first and second conductors on the external insulator.

A first capacitance may be formed between the first conductor and the third conductor, a second capacitance may be formed between the second conductor and the third conductor, and a third capacitance may be formed between the first conductor and the second conductor. The first conductor and the second conductor may shield the third conductor from conductive material that may collect on the external insulator. As a result, conductive material that may collect on the external insulator should have minimal, if any, effect on the first capacitance or second capacitance.

Figure 4:
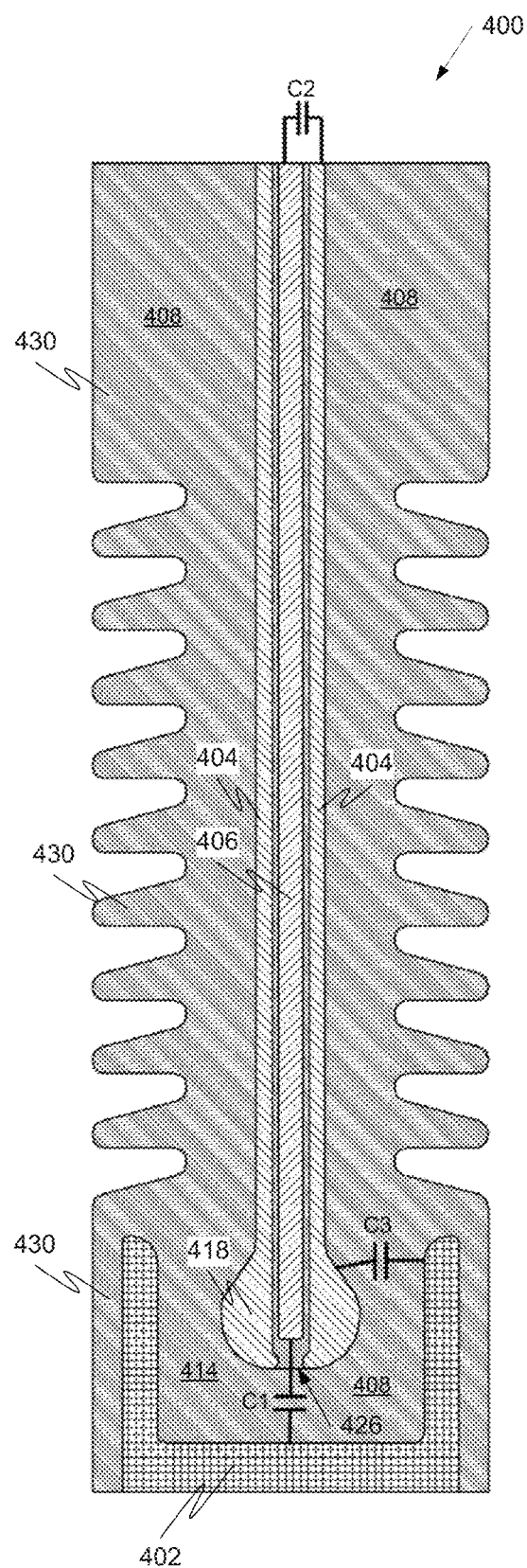
FIG. 4 is a cross-sectional view of another example voltage sensor, which shows an example capacitive network in the interior of the voltage sensor, in accordance with some embodiments.

FIG. 4 is a cross-sectional view of another example voltage sensor 400, which shows an example capacitive network in the interior of the voltage sensor. The example capacitive network includes a first conductor 402, a second conductor 404, and a third conductor 406. The first conductor 402, second conductor 404, and third conductor 406 are separated from each other via insulator material 408. A first capacitance C1 is formed between the first conductor and the third conductor, a second capacitance C2 is formed between the second conductor and the third conductor, and a third capacitance C3 is formed between the first conductor and the second conductor. The capacitive network in the example voltage sensor 400 is similar functionally and structurally to the capacitive network in the example voltage sensor 100 except that, in this example, the capacitive network is rotated 180 degrees and the first conductor 402 comprises a grounded electrode configured to attach to a grounded line, the second conductor 404 comprises a high voltage (HV) electrode configured to attach to a high voltage line, and the third conductor 406 comprises a sensing electrode configured to attach to a sensing line.

The first conductor 402 and the second conductor 404 shield the third conductor 406 from conductive material that may collect on an external insulator 430 that is formed around the first conductor 402 and the second conductor 404. As a result, the first capacitance C1 and the second capacitance C2 may not be affected by the conductive material that may form on the external insulator 430. The first conductor 402 and the second conductor 404 may shield the third conductor 406 from the conductive material that collects on the external insulator 430 by eliminating a line of sight from the conductive material that collects on the external insulator to the third conductor 406 whereby the conductive material that collects on the external insulator 430 has negligible effect on the first capacitance C1 and the second capacitance C2. For this shielding to be effective, a bottom section 418 of the second conductor 404 should extend significantly into a first interior space 414, e.g., by at least by 0.5 inches.

In the example capacitive network, the sensing electrode 406 is completely enclosed within the interior of the HV electrode 404 with only a small opening 426 in the HV electrode 404 that provides a line-of-sight between the sensing electrode 406 and the grounded electrode 402. Also, in the example capacitive network, the grounded electrode 402 is extended as a cup shape around the HV electrode 404. These two measures can prevent a direct line-of-sight between the sensing electrode 406 and the external insulator surface 430 and make capacitance between the sensing electrode 406 and the grounded electrode 402 practically independent of a conductive layer on the insulator surface 430. This can result in a capacitive divider ratio between the first capacitance C1 and the second capacitance C2 being completely unaffected by pollution and ice deposits on the insulator surface 430.

The subject matter described herein provides an architecture that can prevent a direct line-of-sight between a sensing electrode and an external insulator surface. The architecture may make the capacitance between a sensing electrode and other electrodes practically independent of a conductive layer on the insulator surface.

For the sake of brevity, conventional techniques related to power distribution systems and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

The foregoing description may refer to elements or components or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the drawings may depict one exemplary arrangement of elements with direct electrical connections, additional intervening elements, devices, features, or components may be present in an embodiment of the depicted subject matter. In addition, certain terminology may also be used in the following description for the purpose of reference only, and thus are not intended to be limiting. For example, the terms "first," "second," and other such numerical terms referring to structures do not imply a sequence or order unless clearly indicated by the context.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the subject matter in any way. Rather, the foregoing detailed description will provide those skilled in the art with a convenient road map for implementing an exemplary embodiment of the subject matter. It should be understood that various changes may be made in the function and arrangement of elements described in an exemplary embodiment without departing from the scope of the subject matter as set forth in the appended claims. Accordingly, details of the exemplary embodiments or other limitations described above should not be read into the claims absent a clear intention to the contrary.

What is claimed is:

1. A capacitive network for use in a voltage sensor, the capacitive network comprising:
    a first conductor shaped to form a boundary that separates a first interior space and a first exterior space;
    a second conductor shaped to form a boundary that encircles a second interior space and separates the second interior space from a second exterior space;
    a third conductor disposed in the second interior space and having a line of sight to the first conductor through an opening in the second conductor; and
    an external insulator formed around the first conductor and the second conductor in the first exterior space and the second exterior space;
    wherein a first capacitance is formed between the first conductor and the third conductor and a second capacitance is formed between the second conductor and the third conductor whereby conductive material that may collect on the external insulator may have negligible effect on the first capacitance and the second capacitance.

2. The capacitive network of claim 1, wherein the first conductor is configured to attach to a high voltage line and the second conductor is configured to attach to a grounded voltage line.

3. The capacitive network of claim 1, wherein the first conductor is configured to attach to a grounded voltage line and the second conductor is configured to attach to a high voltage line.

4. The capacitive network of claim 1, wherein the third conductor is configured to attach to a sensing line.

5. The capacitive network of claim 1, wherein the opening is in a top section of the second conductor and the top section extends into the first interior space by at least 0.5 inches.

6. The capacitive network of claim 5, wherein a first end section of the third conductor does not extend into the first interior space and remains below the opening in the second conductor for at least 0.1 inches.

7. The capacitive network of claim 1, wherein the first conductor and the second conductor cooperate to eliminate a line of sight from the third conductor to the conductive material that collects on the external insulator.

8. The capacitive network of claim 7, wherein the first conductor and the second conductor cooperate to shield the third conductor from the conductive material that collects on the external insulator by eliminating a line of sight from the conductive material that collects on the external insulator to the third conductor wherein the conductive material that collects on the external insulator has negligible effect on the first capacitance and the second capacitance.

9. The capacitive network of claim 1, wherein:
    the first conductor has a bottom section and one or more sides extending away from the bottom section, the bottom section and the one or more sides cooperating to form the boundary that separates the first interior space and the first exterior space, wherein the first interior space includes insulator material;

the second conductor has a top section and one or more sides extending away from the top section, the one or more sides joining together to form the boundary that encircles the second interior space and separates the second interior space from the second exterior space, the top section including the opening; and the third conductor is separated from the second conductor via insulator material.

10. The capacitive network of claim 9, wherein the bottom section and the one or more sides of the first conductor cooperate to form a cup-like shape.

11. A voltage sensor comprising:
an amplifier configured to receive a sensing voltage level from a capacitive divider and output an amplified output to an analog to digital converter; and
a capacitive network configured to provide the capacitive divider, the capacitive network comprising:
a first conductor shaped to form a boundary that separates a first interior space and a first exterior space;
a second conductor shaped to form a boundary that encircles a second interior space and separates the second interior space from a second exterior space;
a third conductor disposed in the second interior space and having a line of sight to the first conductor through an opening in the second conductor; and
an external insulator formed around the first conductor and the second conductor in the first exterior space and the second exterior space;
wherein a first capacitance is formed between the first conductor and the third conductor, a second capacitance is formed between the second conductor and the third conductor, and the capacitive divider includes the first capacitance and the second capacitance.

12. The voltage sensor of claim 11, wherein the amplifier is configured to receive the sensing voltage level from the capacitive divider via a resistive divider network.

13. The voltage sensor of claim 11, wherein the opening is in a top section of the second conductor and the top section extends into the first interior space by at least 0.5 inches.

14. The voltage sensor of claim 13, wherein a first end section of the third conductor does not extend into the first interior space and remains below the opening in the second conductor for at least 0.1 inches.

15. The voltage sensor of claim 11, wherein the first conductor and the second conductor cooperate to eliminate a line of sight from the third conductor to the conductive material that collects on the external insulator.

16. The voltage sensor of claim 15, wherein the first conductor and the second conductor cooperate to shield the third conductor from the conductive material that collects on the external insulator by eliminating a line of sight from the conductive material that collects on the external insulator to the third conductor wherein the conductive material that collects on the external insulator has negligible effect on the first capacitance and the second capacitance.

17. The voltage sensor of claim 11, wherein:
the first conductor has a bottom section and one or more sides extending away from the bottom section, the bottom section and the one or more sides cooperating to form the boundary that separates the first interior space and the first exterior space, wherein the first interior space includes insulator material;
the second conductor has a top section and one or more sides extending away from the top section, the one or more sides joining together to form the boundary that encircles the second interior space and separates the second interior space from the second exterior space, the top section including the opening; and
the third conductor is separated from the second conductor via insulator material.

18. The voltage sensor of claim 17, wherein the bottom section and the one or more sides of the first conductor cooperate to form a cup-like shape.

19. A method in a voltage sensor, the method comprising:
applying a first voltage to a first conductor that is formed in a shape that cooperates with a second conductor to shield a third conductor from conductive material external to the first and second conductors;
applying a second voltage to the second conductor that is formed in a shape that cooperates with the first conductor to shield the third conductor from conductive material external to the first and second conductors; and
sensing a third voltage at the third conductor with respect to the second conductor, wherein the third conductor is shielded from capacitive coupling from conductive material external to the first and second conductors and deposited on the insulator surface, wherein:
the first conductor is shaped to form a boundary that separates a first interior space and a first exterior space;
the second conductor is shaped to form a boundary that encircles a second interior space and separates the second interior space from a second exterior space;
the third conductor is disposed in the second interior space and has a line of sight to the first conductor through an opening in the second conductor; and
an external insulator is formed around the first conductor and the second conductor in the first exterior space and the second exterior space, wherein the first conductor and the second conductor cooperate to eliminate a line of sight from the third conductor to the conductive material external to the first and second conductors on the external insulator;
wherein a first capacitance is formed between the first conductor and the third conductor, a second capacitance is formed between the second conductor and the third conductor, and the conductive material that collects on the external insulator has negligible effect on the first capacitance and the second capacitance.

* * * * *